(12) United States Patent
Goktepeli et al.

(10) Patent No.: US 7,344,933 B2
(45) Date of Patent: Mar. 18, 2008

(54) METHOD OF FORMING DEVICE HAVING A RAISED EXTENSION REGION

(75) Inventors: Sinan Goktepeli, Austin, TX (US); Mark C. Foisy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 142 days.

(21) Appl. No.: 11/324,510

(22) Filed: Jan. 3, 2006

(65) Prior Publication Data
US 2007/0155073 A1   Jul. 5, 2007

(51) Int. Cl.
*H01L 21/336* (2006.01)
*H01L 21/8234* (2006.01)

(52) U.S. Cl. .......... 438/197; 438/506; 438/933; 257/E21.092; 257/E21.115; 257/E21.134; 257/E21.319; 257/E21.32; 257/E21.632

(58) Field of Classification Search .......... 438/197, 438/217, 289, 290, 311, 174, 506, 510, 514, 438/475, 772, 753, 933
See application file for complete search history.

(56) References Cited

U.S. PATENT DOCUMENTS 6,891,235 B1 * 5/2005 Furukawa et al. .......... 257/408
7,002,214 B1 * 2/2006 Boyd et al. .................. 257/351
7,176,530 B1 * 2/2007 Bulucea et al. ............. 257/369
2004/0175893 A1 * 9/2004 Vatus et al. ................. 438/300
2007/0093033 A1 * 4/2007 Wang et al. ................ 438/303
2007/0096170 A1 * 5/2007 Chidambarrao et al. .... 257/288

OTHER PUBLICATIONS

Nakahara et al., "Ultra-Shallow In-Situ-Doped Raised Source/Drain Structure for Sub-Tenth Micron CMOS," 1996 Symposium on VLSI Technology Digest of Technical Papers, 1996 IEEE, pp. 174-175, NEC Corporation, Kanagawa Japan.

* cited by examiner

Primary Examiner—David Nhu

(57) ABSTRACT

A method is disclosed of forming an extension region for a transistor having a gate structure overlying a compound semiconductor layer. An anneal is used either before or after deep source/drain implantation to diffuse a dopant from a raised region adjacent the gate structure to a location underlying the gate structure. A non-diffusing activation process can be used to activate source/drain implants when the dopants from the raised region are diffused prior to deep source/drain implantation.

20 Claims, 4 Drawing Sheets

METHOD OF FORMING DEVICE HAVING A RAISED EXTENSION REGION

BACKGROUND

1. Field of the Disclosure

The present disclosure relates generally to the manufacture of integrated circuits and more particularly to a method of doping integrated circuits.

2. Description of the Related Art

The difference between electron mobility and hole mobility in silicon channel regions of PMOS and NMOS devices, respectively, is a well-recognized issue in the manufacturing of CMOS semiconductor devices. One proposed method of increasing hole mobility in PMOS devices to more closely match the electron mobility of NMOS devices is to form a channel region including SiGe, which is known to facilitate greater hole mobility than silicon without Germanium. This is typically accomplished by forming a strained SiGe epitaxial layer over silicon at PMOS channel regions prior to forming the PMOS transistor gate.

While the use of SiGe channels improves hole mobility in PMOS devices, their use introduces multiple materials under the gate, SiGe and Si, that have different dopant diffusion properties. This difference in diffusion properties complicates formation of source/drain extension regions. For example, diffusion of implanted Boron below the PMOS gate occurs at a faster rate in the Silicon layer than in the SiGe layer. This difference in Boron diffusion rates results in greater lateral diffusion of Boron in the Silicon layer than in the SiGe layer, which produces an extension region in the Silicon portion of the channel that has a source/drain junction spacing that is less than the source/drain junction spacing within the SiGe portion of the channel. The smaller source/drain junction spacing within the Silicon portion of the channel is disadvantageous in that it increases the leakage of PMOS transistors. Therefore, a device and method of overcoming these problems would be useful.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
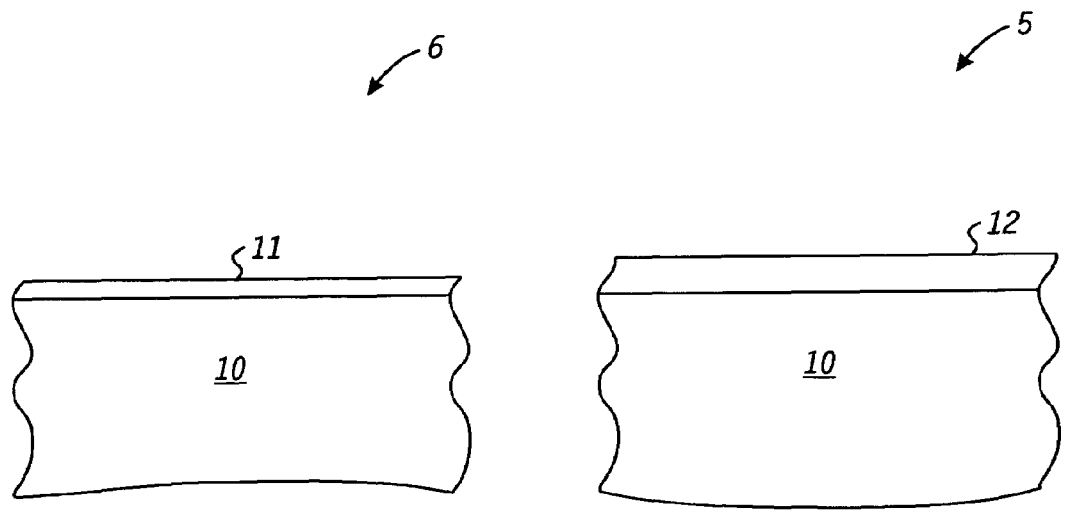
FIGS. 1-8 illustrate a semiconductor workpiece at various processing stages in accordance with a specific embodiment of the present disclosure.

A method is disclosed for forming a raised extension region that is in-situ doped overlying a compressively strained Silicon Germanium (SiGe) layer. The amount of diffusion below a channel region formed in the SiGe layer is reduced, thereby resulting in a device having improved device performance. Specific embodiments of the present disclosure will be better understood by FIGS. 1-8 as described herein.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "compound semiconductor" is intended to mean a combination of two or more elements that form a semiconductor. For example, a compound semiconductor can include two dissimilar group 14 elements, at least one group 13 element and at least one group 15 semiconductor element, at least one group 12 and at least one group 16 element, or a combination thereof.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" is intended to mean a substrate and, if any, one or more layers, one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 illustrates locations 5 and 6 of workpiece 100 at which a semiconductor device is being formed. Workpiece 100 of FIG. 1 includes substrate 10, layer 11, and layer 12. Substrate 10 can be a monocrystalline semiconductor wafer or a semiconductor-on-insulator wafer.

Substrate 10 at location 6 of workpiece 100 has a well implant (not specifically shown) for NMOS transistor formation, while substrate 10 at location 5 has a well implant for PMOS transistor formation. Layer 11 is a protective layer, such as an oxide, that prevents formation of an epitaxial layer 12, which is a compound semiconductor formed at location 5. In a specific embodiment the material of layer 12 is a silicon germanium (SiGe), which in one embodiment can include compressively strained silicon germanium (cSiGe) material overlying substrate 10, though materials that are unstrained and tensily strained are contemplated. Layer 12 can be formed using conventional and proprietary growth techniques as are known in the art. In accordance with one embodiment, the ratio of germanium to the total atoms in a SiGe material forming layer 12 is in the range of 1:2-8. In an alternate embodiment, the SiGe material forming layer 12 can be capped with a thin layer (not shown), less than approximately 20 Angstroms, of Silicon to ensure good quality of an oxide interface.

Figure 2:
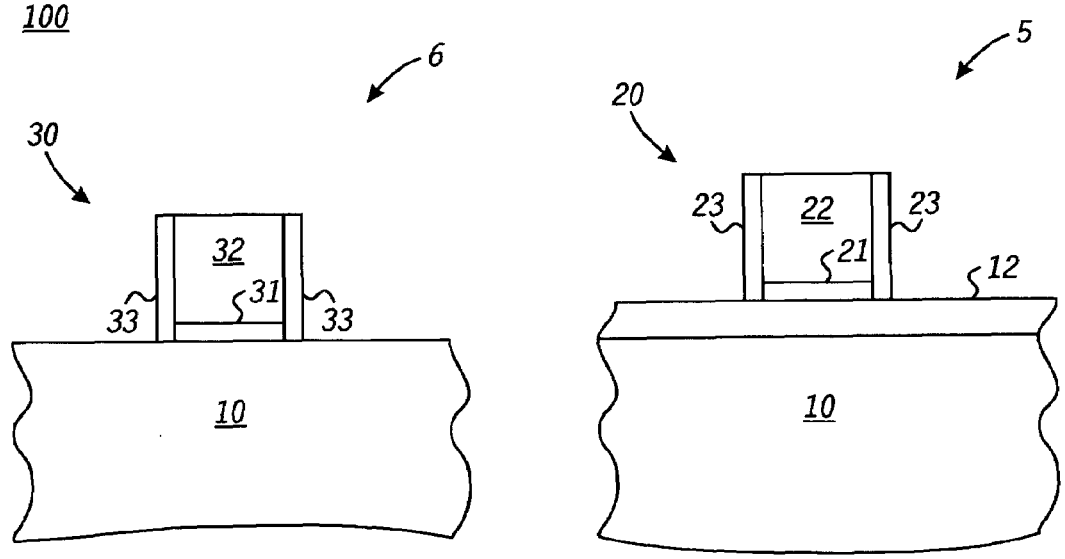

FIG. 2 illustrates location 5 and 6 of workpiece 100 after formation of PMOS gate structure 20 overlying layer 12, and NMOS gate structure 30. NMOS gate structure 30 includes a gate dielectric 31, conductive gate 32, and sidewalls 33. PMOS gate structure 20 includes a gate dielectric 21, conductive gate 22, and sidewalls 23. Gate dielectric 21 can have a thickness of approximately 10-100 Angstroms that is typically approximately 15 Angstroms when formed from silicon dioxide. Conductive gate 22 can have a gate length of approximately 5000 Angstroms or less, that is typically approximately 400 Angstroms. Sidewalls 23 can have a thickness of approximately 50-200 Angstroms. Sidewall 23 can include dielectric material, such as a nitride, or silicon nitride, to prevent damage to exposed components of the gate structure during subsequent epitaxial growth. Sidewall 23 may be a stack having more than one layer. For example, sidewall 23 can include a nitride layer overlying an oxide layer to provide a soft landing for the nitride etch. Conventional and proprietary deposition and growth techniques can be used along with known masking techniques to form gate structures 20 and 30. In one embodiment, the gate structures 20 and 30 are formed on the layer 12 in one of a <110> or <100> direction.

Figure 3:
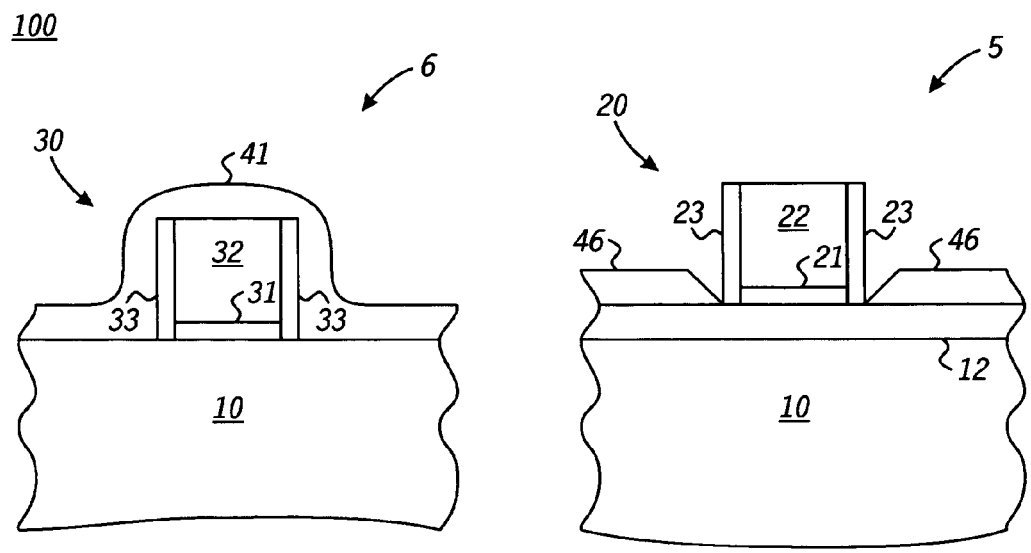

FIG. 3 illustrates workpiece 100 after formation of layer 41 overlying location 6. In one embodiment, layer 41 represents a hardmask overlying NMOS transistor locations of workpiece 100 to protect NMOS transistor locations from subsequent PMOS processes. Layer 41 can include an oxide, a nitride, such as silicon nitride, or can combinations thereof, and the like. Layer 41 may be a stack having more than one layer.

Subsequent to formation of mask 41 at location 6, layer 46 is formed adjacent to the gate structure 20 at location 5. In one embodiment, layer 46 is an in-situ doped epitaxial layer that includes a dopant of a specific conductivity type, i.e. P or N doped conductivity type, that is substantially absent from the material of the underlying layer 12. In an alternate embodiment, layer 46 includes a dopant that is introduced using a shallow ion implant such that the dopant is substantially absent from the material of the underlying layer 12. For example, such a shallow implantation can be accomplished using a BF2 implant with an energy of 0.5-3 keV and a dose of 5e14-2e15 atoms/cm2. Layer 46 is formed beginning at an outer sidewall of the sidewall 23, that is formed to have first portion with a gradient portion, as illustrated by the angle of approximately 45 degrees between the outer sidewall and a facet formed by layer 46, and a second portion having a substantially constant thickness that abuts the first portion and extends away from the gate structure 20. Similarly, there is an angle of approximately 45 degrees between the facet formed by layer 46 and the surface of layer 12. The approximately 45-degree angle is accomplished, for example, by layer 46 having a (111) facet. In one embodiment, layer 46 is grown using epitaxial techniques, and includes a semiconductor element that can be the same as a semiconductor element of layer 12. For example, layer 46 can include silicon, silicon germanium (SiGe), or the like. Layer 46 can be formed using conventional or proprietary growth or deposition techniques as are know in the art. A typical thickness of layer 46 is less than 500 Angstroms. For example, layer 46 can have a thickness of less than 250 Angstroms, less than 150 Angstroms, or less than 100 Angstroms. It will be appreciated that the first portion of layer 46 will have an average thickness that is approximately one-half of the average thickness of the second portion of layer 46 that is substantially parallel a major surface of the substrate 10. In other embodiments, it is anticipated that the first portion, which is less thick than the second portion, can be formed using different angles and structures than that illustrated. For example, a 30-degree or a 19.5-degree angle is anticipated, as are multi-tiered structures, i.e. stair step type structures, which themselves can have angled, i.e., faceted, edges. In one embodiment, layer 46 can be formed using $Si_2H_2Cl_2$, $GeH_4$ $B_2H_6$ (for in-situ doping), and $H_2$ gases. The temperature is approximately 600 C and pressure is approximately 10 torr. The angle between the sidewall 23 and the facet formed by layer 46 can be controlled by adjusting the deposition rate and/or the pressure. For example, when either of them is raised, the angle of the facet increases.

Layer 46 is doped with a P-type dopant, such as boron or the like, to, form a raised source drain extension (SDE) region for the PMOS transistor being formed at layer location 5. When boron is the dopant, a concentration of approximately 2E20-5E20 $cm^{-3}$ can be used. During a subsequent anneal process, the P-type dopant will diffuse down into layer 12 from layer 46. Because the dopants associated with the extension region of location 5 are formed within layer 46, the SiGe layer 12 is able to retard their diffusion from layer 46 in a manner that reduces overlap with the gate. For example, the amount of P-type dopant able to diffuse into, and therefore laterally within, the underlying substrate 10 is reduced. Within Layer 12, which is a SiGe material, dopant from layer 46 diffuses slower than within substrate 10, which is a Si material. Layer 12 also retards diffusion into substrate 10, where the dopant atoms would otherwise rapidly diffuse, adversely affecting device properties such as short channel control. This, in combination with faceted raised source/drain extensions (layer 46), results in devices with an improved Miller capacitance and channel mobility, better short channel control, lower leakage current, and reduced series resistance relative previous methods.

Figure 4:
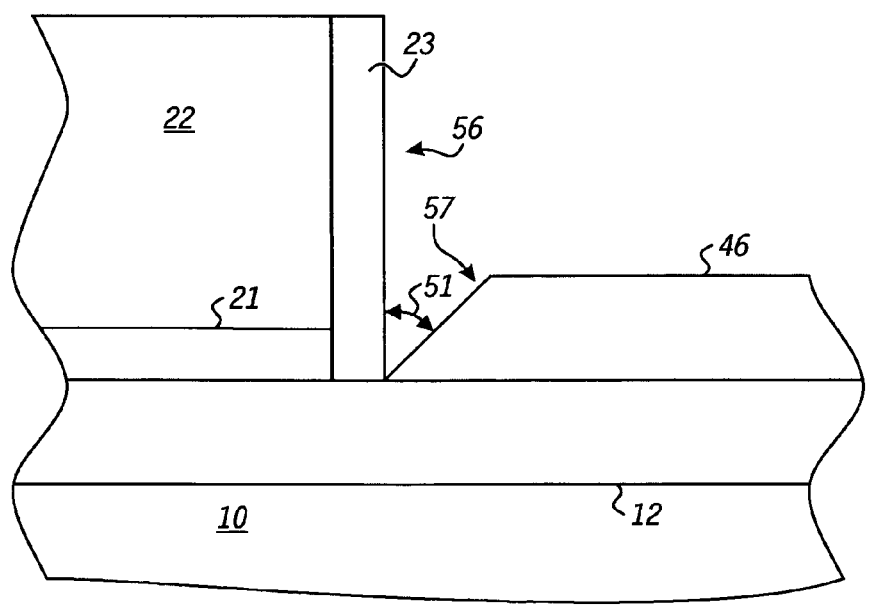

FIG. 4 illustrates a portion of FIG. 3 in greater detail. Specifically, illustrated is a portion that includes the facet portion of layer 46. Angle 51 is the angle between the facet 57 and an outer surface of the gate structure 20, i.e., the outer surface of the sidewall structure 23.

Figure 5:
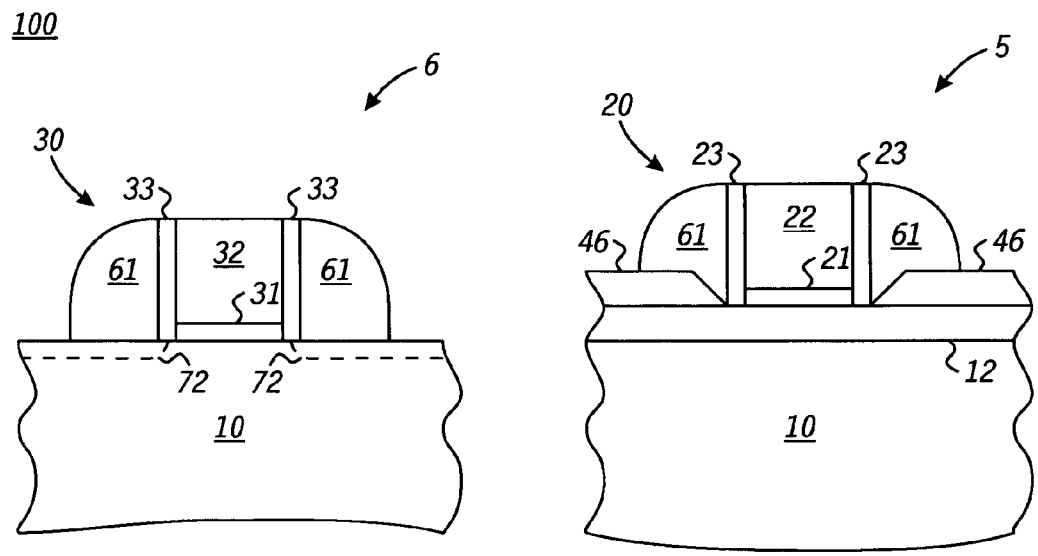

FIG. 5 illustrates workpiece 100 after removal of mask 41 from location 6, implantation of NMOS source/drain extensions 72, and formation of sidewall structures 61. Sidewall structures 61 act as source/drain spacers and can include one or more layers and be formed using conventional and proprietary deposition and growth techniques in combination with etching and masking techniques as are well known. An outer portion of sidewall structures 61 can include an oxide, nitride, or the like, and combinations thereof. The thickness of sidewall structures 61 can vary depending upon process parameters, but will typically be approximately 300-1000 Angstroms.

Figure 6:
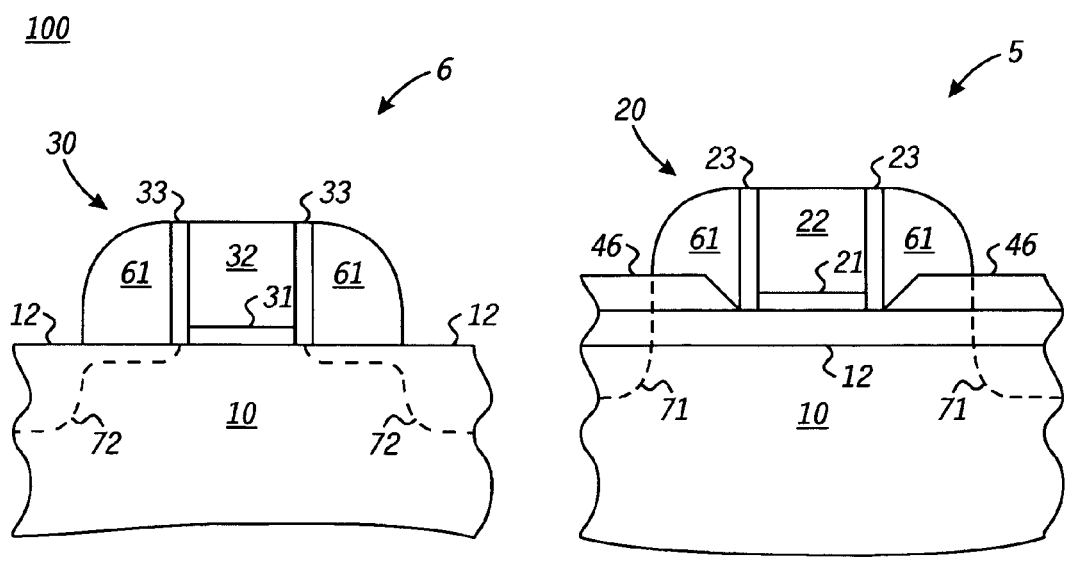

FIG. 6 illustrates workpiece 100 subsequent to implantation of source/drain dopants at region 71. Specifically illustrated is N-type source/drain region 72 and P-type source drain region 71. The previously implanted NMOS source/drain extension and new NMOS source/drain dopants have merged to form the modified profile 72. Source/drain implants 71 and 72 can be formed using conventional and proprietary implantation techniques that are well known. Typical dopant concentrations for the P-type source drain region 71 are 1E21 cm$^{-3}$. It will be appreciated that while conventional source/drain regions are specifically illustrated, that other types of source/drain region embodiments, such as raised source/drains, are compatible with the disclosure herein.

Figure 7:
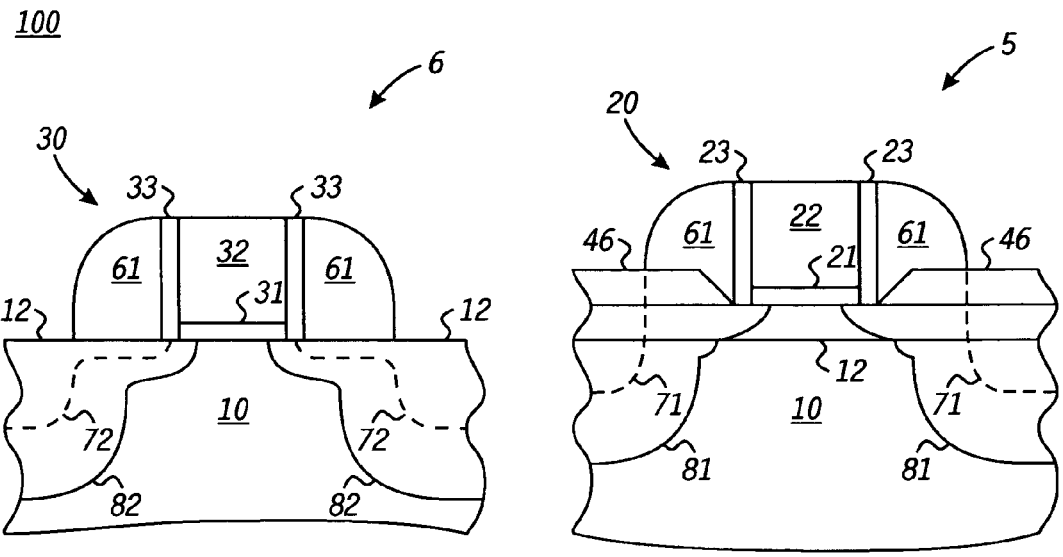

FIG. 7 illustrates workpiece 100 subsequent to anneal processes that activate dopants as previously discussed. During an anneal process the dopants diffuse and become activated. Regions 81 and 82 correspond to doped regions subsequent to the anneal process as discussed with reference to FIG. 6. Note, it will be appreciated that diffused dopants that form portions of the extension region underlying the gate structure, which can include spacer 23, can be formed prior to activation of the deep source/drain regions, though not specifically illustrated in previous figures.

Figure 8:
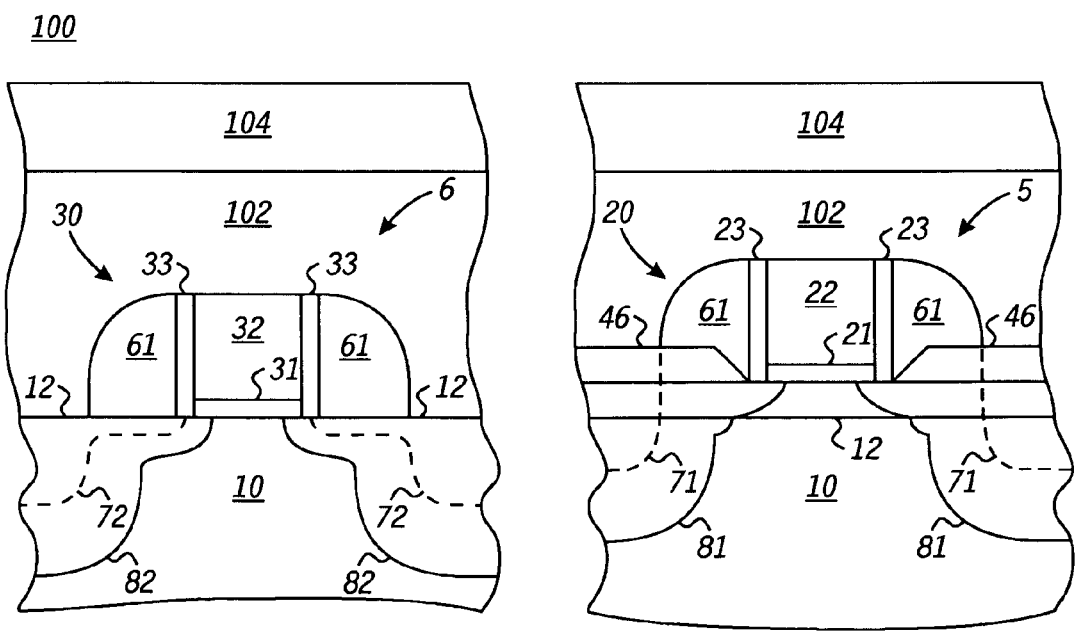

FIG. 8 illustrates workpiece 100 as a completed electronic device that includes additional layers 102 and a passivation layer 104. Note that interconnect structures are not specifically illustrated at the cross-sectional view of FIG. 8.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below.

It will be appreciated, that while diffusion of dopants out of the epitaxial layer and activation may be done subsequent to source/drain implantation, in an alternate embodiment, a dedicated anneal may be performed at anytime after forming epitaxial layer 46, including prior to implantation of deep source/drain dopants, in order to facilitate diffusion of dopants from the epitaxial layer. This will enable a final anneal to be replaced by another activation process, such as a diffusionless laser anneal process that results in substantially no additional diffusion of the dopants. Additionally, one skilled in the art will appreciate that while formation of an PMOS transistor is specifically described herein, that similar techniques can be used to form NMOS transistors. For example, a gate structure of a NMOS transistor can be formed overlying a SiC compound semiconductor, and the epitaxial layer 46 can include a dopant that is diffused under the gate structure that has an opposite conductivity type of that used for an PMOS transistor. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

Other embodiments, uses, and advantages of the present disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    forming a first gate structure overlying and abutting a first surface, the first gate structure comprising a gate dielectric and a conductive gate, wherein a material of the first surface comprises a compound semiconductor material;
    forming a first sidewall spacer abutting the first gate structure;
    forming an epitaxial layer on a second surface at a source/drain location associated with the first gate structure, a first portion of the epitaxial layer beginning at an outer surface of the first sidewall and a second portion of the epitaxial layer abutting the first portion and extending away from the outer surface of the first sidewall, wherein the first portion having a first average thickness, the second portion having a second average thickness greater than the first average thickness, wherein the epitaxial layer comprises a dopant that is substantially absent from a material of the second surface, the dopant having a first conductivity type.

2. The method of claim 1 wherein forming the epitaxial layer comprises forming the epitaxial layer as an in situ doped epitaxial layer including the dopant.

3. The method of claim 1 wherein forming the epitaxial layer comprises doping the epitaxial layer using an ion implantation.

4. The method of claim 1 further comprising annealing the epitaxial layer prior to implanting deep source/drain dopants.

5. The method of claim 4 further comprising activating deep source/drain implant with a substantially non-diffusing activation process.

6. The method of claim 1 wherein the compound semiconductor material comprises
    at least two dissimilar group 14 semiconductor elements;
    at least one group 13 and at least one group 15 semiconductor element;
    at least one group 12 and at least one group 16 semiconductor element; or
    combination thereof.

7. The method of claim 6 wherein the compound semiconductor material comprises at least one of carbon and germanium.

8. The method of claim 7 wherein the compound semiconductor material comprises silicon and a ratio of germanium to total atoms in the material forming the first surface is in a range of approximately 1:2-8.

9. The method of claim 1 wherein forming the first gate structure further comprises forming the first gate structure aligned on the first surface in one of a <110> direction and a <100> direction.

10. The method of claim 1 wherein the first average thickness of is in the range of approximately 10-50 nm.

11. The method of claim 1 wherein the first average thickness is approximately one-half of the second average thickness.

12. The method of claim 1 wherein the first average thickness is in the range of approximately 15-25 nm.

13. The method of claim 1 wherein the first conductivity type is a P-type conductivity.

14. The method of claim 1 wherein the first conductivity type is a N-type conductivity.

15. The method of claim 1 further comprising diffusing dopants from the epitaxial layer to a region underlying the first sidewall spacer to form at least a portion of an extension region.

16. The method of claim 1 further comprising:
forming a second gate structure overlying and abutting a third surface prior to forming the epitaxial layer; and
forming a mask layer overlying the second gate structure prior to forming the epitaxial layer to prevent formation of the epitaxial layer at a location associated with the second gate structure.

17. The method of claim 16 wherein first gate structure overlies a channel of a first conductivity type, and the second gate structure overlies a channel of a second conductivity type, wherein the second conductivity type is opposite the first conductivity type.

18. The method of claim 1 wherein forming the first sidewall spacer comprises the first sidewall spacer having a dimension of approximately 200 angstroms or less between the first gate structure and the outer surface of the first sidewall spacer.

19. The method of claim 1 further comprising:
forming a second sidewall spacer overlying the first portion of the epitaxial layer, wherein the first sidewall spacer is between the conductive gate and the second sidewall spacer; and
implanting deep source/drain dopants at a source/drain region associated with the first gate structure, wherein a location of the deep source/drain region is based upon a location of the second sidewall spacer.

20. A method comprising:
forming a gate structure overlying a channel region comprising a compound semiconductor material, wherein the gate structure comprises a gate dielectric and conductive gate; and
forming an extension region having a plurality of dopant atoms, wherein a majority of the plurality of dopant atoms is diffused into the extension region from a material lying on and above a plane defined by an interface between the gate dielectric and the channel region.

* * * * *